United States Patent
Doolittle

(10) Patent No.: US 7,173,286 B2
(45) Date of Patent: Feb. 6, 2007

(54) SEMICONDUCTOR DEVICES FORMED OF III-NITRIDE COMPOUNDS, LITHIUM-NIOBATE-TANTALATE, AND SILICON CARBIDE

(75) Inventor: William Alan Doolittle, Hampton, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 10/367,275

(22) Filed: Feb. 14, 2003

(65) Prior Publication Data

US 2003/0155574 A1 Aug. 21, 2003

Related U.S. Application Data

(60) Provisional application No. 60/357,296, filed on Feb. 15, 2002.

(51) Int. Cl.
| | |
|---|---|
| H01L 29/22 | (2006.01) |
| H01L 31/0256 | (2006.01) |
| H01L 31/0296 | (2006.01) |
| H01L 33/00 | (2006.01) |
| H01L 31/12 | (2006.01) |

(52) U.S. Cl. .................... 257/78; 257/103; 257/87
(58) Field of Classification Search ............ 257/13, 257/86, 87–103, 77, 11; 438/22, 24, 46, 438/47
See application file for complete search history.

(56) References Cited

U.S. PATENT DOCUMENTS

| | | | |
|---|---|---|---|
| 5,307,305 A | 4/1994 | Takasu | ............... 365/145 |
| 5,625,202 A | 4/1997 | Chai | |
| 5,787,104 A * | 7/1998 | Kamiyama et al. | ............ 372/43 |
| 5,796,902 A | 8/1998 | Bhat | ............... 385/122 |
| 5,909,303 A | 6/1999 | Trezza | ............... 359/248 |
| 6,326,638 B1 | 12/2001 | Kamiyama | ............... 257/13 |
| 6,426,512 B1 | 7/2002 | Ito et al. | |
| 6,870,204 B2 * | 3/2005 | Torvik et al. | ............... 257/197 |

FOREIGN PATENT DOCUMENTS

JP 6-214129 * 8/1994

OTHER PUBLICATIONS

W. Alan Doolittle et al., "III-Nitride Growth on Lithium Niobate", MRS symposium Processing 2002.*
W. Alan Doolittle, Gon Namkoong, Alexander Carver, Walter Henderson, Dieter Jundt, April S. Brown, "III-Nitride Growth on Lithium Niobate: A New Substrate Material for Polarity Engineering in III-Nitride Heteroepitaxy," MRS Symposium Proceedings, Boston 2002, pp. 1-6.

* cited by examiner

Primary Examiner—Cuong Nguyen
(74) Attorney, Agent, or Firm—Thomas, Kayden, Horstemeyer & Risley LLP

(57) ABSTRACT

Semiconductor devices formed by depositing III-nitride compounds on lithium niobate and/or lithium tantalate substrates are disclosed. Also disclosed, are semiconductor devices formed by depositing lithium niobate and/or lithium tantalate on III-Nitrides and Silicon Carbide substrates. The semiconductor devices provide good lattice matching characteristics between the substrate and the material that is deposited upon the substrate. The method of forming such semiconductor devices, which is also disclosed, enables fabrication of periodically-poled devices in a manner that is advantageous in comparison to existing technologies.

15 Claims, 4 Drawing Sheets

US 7,173,286 B2

SEMICONDUCTOR DEVICES FORMED OF III-NITRIDE COMPOUNDS, LITHIUM-NIOBATE-TANTALATE, AND SILICON CARBIDE

CROSS REFERENCE TO RELATED APPLICATIONS

This application claims the benefit of U.S. Provisional Patent Application Ser. No. 60/357,296 filed Feb. 15, 2002, which is incorporated herein by reference in its entirety.

FIELD OF THE INVENTION

The present invention generally relates to semiconductors formed of a substrate and material deposited on this substrate. More specifically it relates to depositing III-nitride compounds on lithium niobate and/or lithium tantalate substrates, and the inverse thereof including lithium niobate and/or lithium tantalate on III-Nitrides and Silicon Carbide substrates.

BACKGROUND AND PRIOR ART

Various substrate materials, such as silicon, silicon carbide, and sapphire have been used in the manufacture of semiconductor products including LEDs, laser diodes, and photo detectors. With the advent of newer semiconductor technologies, such as those used to produce blue LEDs using type III–V nitride compounds, these traditional substrate materials have turned out to have certain handicaps.

For example, growing a gallium nitride (GaN) semiconductor layer on a silicon substrate has proven to be difficult for several reasons, one of which relates to the differences in linear expansion coefficients between silicon (Si) and GaN. While Si has a linear expansion coefficient of ~$2.6 \times 10^{-6}$/K, GaN has a linear expansion coefficient of ~$5.59 \times 10^{-6}$/K. Given this difference in expansion coefficients, the application of heat during the growing process causes the Si substrate to expand disproportionately with reference to the expansion of the GaN layer thereby leading to misalignment of the lattice structures between the two materials, or in a more drastic failure situation leading to fractures and cracking of the GaN layer.

Similar to Si, the use of sapphire as a substrate also suffers from several handicaps. One handicap is the cost of the material, while another is the occurrence of crystal lattice mismatch between the sapphire substrate and the deposited GaN thin film, during the manufacture of devices such as blue LEDs. Drawing attention to FIG. 1, it can be observed that a mismatch exists between the unit cell lattice 105 of GaN and the unit cell lattice 110 of sapphire. This mismatch is typically of the order of ~33%. The nitride growth associated with growing GaN upon a sapphire substrate normally occurs on this oxygen sub-lattice 115, which has a slightly distorted hexagonal structure. The mismatch between the unit cell lattice 105 of GaN and the oxygen sub-lattice 115 of sapphire is typically of the order of ~16%. In achieving this value, the GaN unit cell has to be rotated about the C-axis by 30 degrees, resulting in a slightly distorted GaN unit cell. This lattice-mismatch problem may be resolved in a sub-optimal manner, by introducing a buffer layer between the sapphire substrate and the GaN film. Such a buffer layer creates manufacturability issues leading to low yield and high production costs besides reducing the performance of many devices. As an alternative to sapphire, silicon carbide (SiC) has also been used as a substrate for growing GaN thin films. Similar to the sapphire-GaN crystal structure mismatch, the SiC—GaN crystal structure is also mismatched significantly. Also, as per Chai, "in addition to the poor lattice matching, SiC has three additional problems: growth, defects and fabrication. SiC single crystal is produced by physical vapor deposition method at very high temperatures (>2300° C.). The equipment is expensive and the growth process is slow. Moreover, current technology is limited to 40 mm in diameter and the maximum boule length is approximately 50 mm. Secondly, since the growth is invisible, it is not easy to control the growth process and the crystal defects can be very high, including inclusions and hallowed pipe defects. At present, there is no good solution to improve the growth and to eliminate these defects. Thirdly, SiC is a very hard material approaching to the hardness of diamond and it has been used extensively as abrasives. Therefore, wafer slicing and subsequent polishing are very slow processes. In addition, the combination of these problems further adds to the cost of these substrates. Based on these reasons, SiC is not a good substrate for III–V nitride compound semiconductor thin film growth."

To achieve good quality epitaxial thin film growth, it is necessary to have the substrate lattice matched as closely as possible, preferably better than 0.01%, to the lattice of the film material. The lattice match limitations imposed by the use of traditional substrate materials such as sapphire and SiC for growing III-nitride films, highlights the need to identify alternative substrate materials that can provide acceptable lattice matching characteristics, while also providing additional advantages such as strong non-linear behavior, and good ferroelectric, pyroelectric, piezoelectric, acoustic, and optical properties. These properties are very useful in the manufacture of devices such as optical waveguides, wavelength converters, and bulk-acoustic wave devices, which can optionally integrate acoustic/electronic/optical/ferroelectric/pyroelectric/piezoelectric circuits together on a common substrate. For reasons of cost, yield and reliability, it is desirable that such integration be carried out using heterogeneous epitaxy fabrication techniques.

It is also strongly desirable to identify substrates that can play an active role in the fabrication and/or operation of semiconductor devices, unlike traditional substrates that are often limited to operating as a foundation for epitaxy, and at best only contribute to device performance via electrical conduction or electrical insulation. An example of such a desirable active role includes the fabrication of an epitaxial film whose spontaneous polarity can be selectively set in conjunction with the ferroelectric polarity of a suitable substrate.

SUMMARY OF THE INVENTION

A first embodiment includes a semiconductor device having a substrate of lithium niobate tantalate ($LiNb_zTa_{1-z}O_3$) where $0 \leq z \leq 1$; and a group III nitride compound, such as $Al_xIn_yGa_{1-(x+y)}N$, where $0 \leq x \leq 1$ and $0 \leq y \leq 1$ and $0 \leq (x+y) \leq 1$ that is deposited upon the substrate.

In another embodiment, a semiconductor device is formed of a substrate having silicon carbide (SiC); and a first layer of lithium niobate tantalate ($LiNb_xTa_{1-x}O_3$) where $0 \leq z \leq 1$, deposited on the substrate. This device can further include a buffer layer of $Al_xIn_yGa_{1-(x+y)}N$, where $0 \leq x \leq 1$ and $0 \leq y \leq 1$ and $0 \leq (x+y) \leq 1$, located between the substrate and the first layer.

Other embodiments disclose a method for forming a poled semiconductor device, the method including providing a lithium niobate ($LiNbO_3$) substrate that is uniformly poled in a first direction, providing a electric field that traverses a part of the substrate, to create a first area of the substrate that is poled in a second direction, removing the electric field, and depositing a group III nitride compound as on the substrate including the first area of the substrate.

DESCRIPTION OF THE DRAWINGS

Many aspects of the invention can be better understood with reference to the following drawings. The components in the drawings are not necessarily drawn to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENTS

Figure 2:
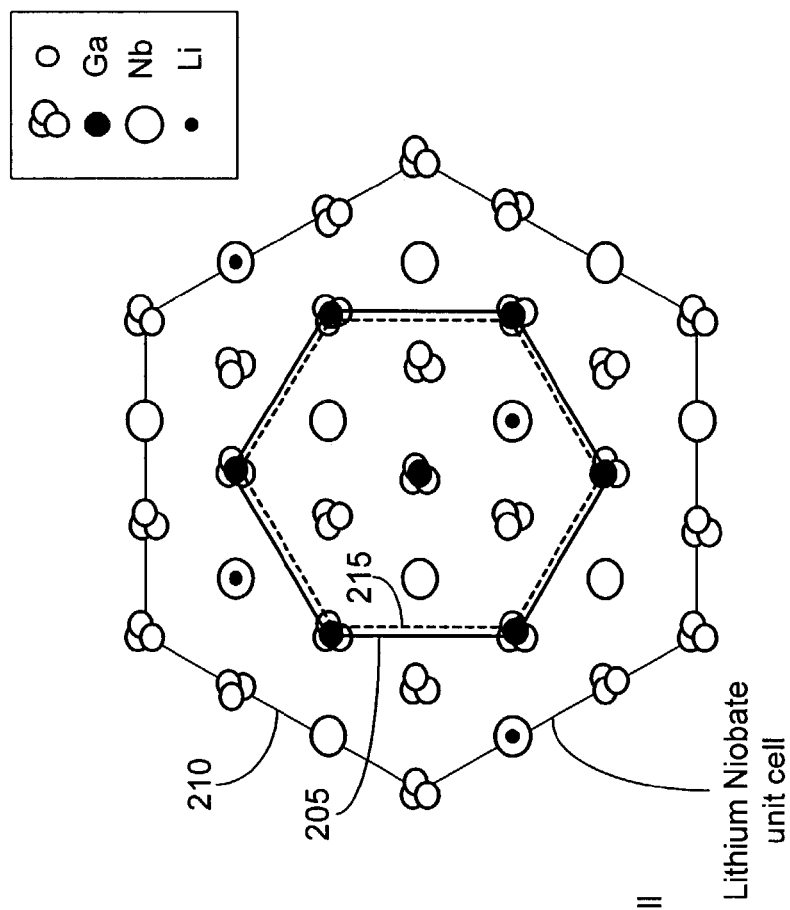
FIG. 2 shows a unit cell lattice of lithium niobate together with a unit cell of GaN and a unit cell sub-lattice of oxygen.

While the description below refers to certain exemplary embodiments, it is to be understood that the invention is not limited to these particular embodiments. On the contrary, the intent is to cover all alternatives, modifications and equivalents included within the spirit and scope of the invention as defined by the appended claims. Also, the terminology used herein is for the purpose of description and not of limitation.

Lithium niobate and lithium tantalate, used separately or jointly as substrate material, provide improved qualities over traditionally used substrates such as sapphire, silicon, and silicon carbide, in the area of lattice-matching between the substrate and a film that is grown upon this substrate. For example, the lattice mismatch between a lithium niobate substrate and a GaN film grown on it roughly equals ~6% in comparison to the lattice mismatch between a sapphire substrate and a GaN film grown on the sapphire, which is ~16%. Such a reduction in lattice mismatch translates to improved semiconductor performance.

Additionally, lithium niobate and lithium tantalate substrates provide the ability to selectively polarize certain areas of the substrate, known in the art as "poling the substrate", followed by polarization of a III-nitride film that is deposited upon this substrate. Such a property, combined with unique material properties such as the ferroelectric/pyroelectric/piezoelectric/optical properties of the lithium niobate and lithium tantalate substrates enables new polarization-engineered devices such as optical waveguides, high-performance transistors, optical switches, optical modulators and optical wavelength converters. TABLE 1 provides a list of some of these properties in comparison to other materials.

TABLE 1

|  | Sapphire | SiC | Si | LiNbO$_3$/LiTaO$_3$ |
|---|---|---|---|---|
| Good Conductor (may require doping) |  | X | X |  |
| Good Insulator | X | X |  | X |
| Good Ferroelectric Properties |  |  |  | X |
| Good Acoustic Properties |  |  |  | X |
| Good Non-linear optical properties |  |  |  | X |
| Good Piezoelectric Properties |  |  |  | X |
| Good Pyroelectric Properties |  |  |  | X |
| Facilitates III-Nitride Polarity control |  |  |  | X |
| Low Cost | X |  | X | X |
| High Cost |  | X |  |  |

Additionally, lithium tantalate shares a number of properties in common with lithium niobate, and it will consequently be understood that lithium tantalate, lithium niobate and a combination thereof may be used in various embodiments of this invention. While reference may be made to one or the other in exemplary fashion, it will be understood that these materials can be used as alternative elements depending on their suitability for each individual application. Such suitability arises from the desire to use certain uniquely advantageous properties of each of these materials.

As an example of such unique properties, in comparing lithium niobate to lithium tantalate, the latter material possesses a higher dielectric constant which could be beneficial in certain capacitively coupled structures and provides more stable behavior during heating which is carried out during the epitaxial growth process; while lithium niobate provides a higher Curie temperature, slightly better optical properties, and slightly lower cost than lithium tantalate.

Lithium niobate is a CZ-grown oxide that is cheaper than sapphire and SiC, typically available in 6" wafer diameters, and traditionally produced in significant quantity for manufacturing optoelectronic modulators and surface acoustic wave devices. In comparison to sapphire, the bulk crystal structure of lithium niobate is more complex due to the "staircase spiraling" nature of the oxygen octahedra, thereby resulting in a larger dispersion of the oxygen atomic positions around their central locations. Fortunately, the surface structure of the lithium niobate on the c-plane is similar to that of sapphire, with one difference—the lithium niobate surface structure has a larger oxygen sub-lattice spacing.

This larger spacing results in a reduction of the average lattice mismatch between lithium niobate and film materials such as III-nitrides and SiC, in comparison to the lattice mismatch between sapphire and such materials. When the average lattice mismatch parameters are evaluated via computer modeling, it is found that the lattice mismatch between sapphire and GaN (lattice constant of the unit cell being 3.185 angstroms) is 15.7%, while the lattice mismatch between lithium niobate and GaN is 6.8%.

A similar analysis between lithium niobate and aluminum nitride (AlN) (3.1114 angstroms) indicates a 4.4% mismatch, between lithium niobate and 4H SiC (a=3.0730) a 3.1% mismatch, and between lithium niobate and 6H SiC (a—3.0806 angstroms) a 3.3% mismatch. These values are to be compared to the 15.7% mismatch between sapphire and the III-nitride element GaN.

A III-nitride metal semiconductor is generally represented by $Al_xIn_yGa_{1-(x+y)}N$, ($0 \leq x \leq 1$ and $0 \leq y \leq 1$ and $0 \leq (x+y) \leq 1$). A layer of such a III-nitride metal semiconductor can be grown on a substrate that is composed of lithium niobate, lithium tantalate, or lithium-niobate-tantalate, such substrate being generally represented by $LiNb_zTa_{1-z}O_3$ ($0 \leq z \leq 1$). The substrate has a hexagonal crystal structure with a c-face that is similar to that of sapphire. This similarity of appearance is illustrated by the unit cell structure 110 and 210 of FIGS. 1 and 2.

Figure 1:
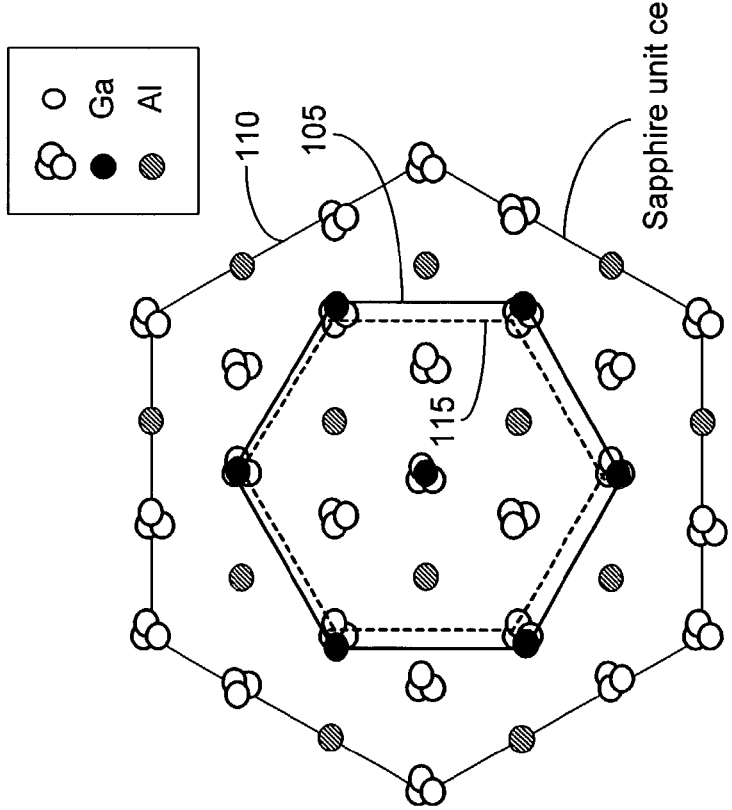
FIG. 1 shows a unit cell lattice of sapphire together with a unit cell of GaN and a unit cell sub-lattice of oxygen.

The oxygen sub-lattice 115 of sapphire (FIG. 1) is slightly smaller than the oxygen sub-lattice 215 of lithium niobate (FIG. 2). Consequently, it can be observed that the mismatch between the oxygen sub-lattice 115 and the GaN unit cell lattice 105 of FIG. 1 is greater than the mismatch between the oxygen sub-lattice 215 and the GaN unit cell lattice 205 of FIG. 2. The lattice mismatch in FIG. 1 is ~15.7%, while that in FIG. 2 is ~6.8%.

A similar comparison of the lattice mismatches using other III-nitride materials, indicates a lithium niobate to AlN (3.114 angstroms) mismatch of 4.4%, a lithium niobate to 4H SiC (a=3.0730 angstroms) mismatch of 3.1%, and a lithium niobate to 6H SiC (a 3.0806 angstroms) mismatch of 3.3%. All three of these exemplary materials indicate mismatch values that are significantly lower than the GaN to sapphire mismatch of ~15.7% shown in FIG. 1 and commonly used in the art.

Figure 3:
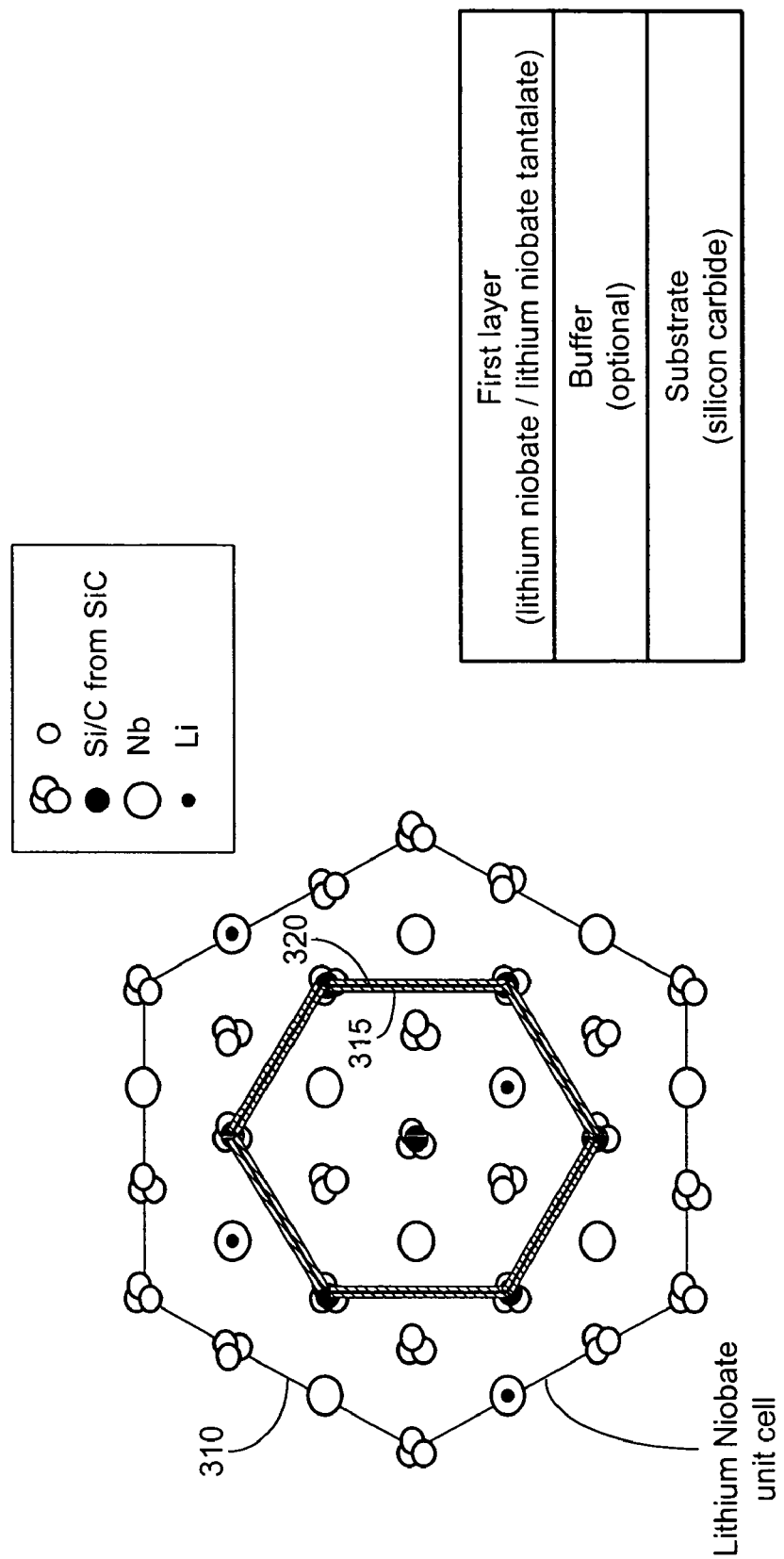
FIG. 3 shows a unit cell lattice of lithium niobate together with a unit cell of Si or C (from SiC) and a unit cell sub-lattice of oxygen.

FIG. 3 shows the lattice structure of a lithium niobate unit cell 310 with reference to a unit cell lattice 320 of SiC, and an oxygen sub-lattice 315. It can be observed that the lithium niobate lattice is well-matched to the SiC lattice, thereby suggesting that Silicon Carbide may be used as a substrate for lithium niobate epitaxy.

It will be understood that while lithium niobate has been referred to in FIGS. 2 and 3, it is done so merely for purposes of example, and can be suitably replaced by the lithium-niobate-tantalate combination referred to earlier. For example, while FIG. 2 referred to lithium niobate as a substrate together with GaN as a film layer deposited on this substrate, FIG. 3 indicates the use of SiC as the substrate together with lithium niobate as a film layer deposited upon it. Therefore, lithium niobate or lithium-niobate-tantalate can be grown on SiC, AlN, GaN and/or AlGaN. It will also be understood, that various combinations of these materials can be used interchangeably as substrate and film material.

Additionally, the use of terms such as "films," "growing," and "growth" are merely exemplary terms that must be interpreted in a broader sense to include several forms of depositing or forming a junction of one or more materials together with a substrate material. While depositing implies an additive process, subtractive processes such as etching or evaporation, may also be used, as is known to persons of ordinary skill in the art.

In a first embodiment to describe an exemplary manufacturing process for depositing III-Nitrides on a lithium niobate substrate, various nucleation conditions were used together with nitridation using an RF nitrogen plasma source. While an RF source is used herein, other options include an ECR plasma or other plasma source, or a chemical compound containing chemically active nitrogen compound or a nitrogen containing compound that is thermally activated to react with the substrate and epitaxial film such as but not limited to ammonia.

The deposition of III-Nitrides on lithium niobate, lithium tantalate, or lithium-niobate-tantalate can be performed in multiple ways, including molecular beam epitaxy (MBE), chemical vapor deposition (CVD) or metal organic chemical vapor deposition (MOCVD). MBE is the preferred embodiment for electronic applications due to it's low temperature, low hydrogen, and low carbon environment.

A buffer layer of a suitable material may be implemented in such a way as to minimize the preferential out-diffusion of Lithium oxide compared to niobium oxide, because this diffusion may lead to the formation of mixed chemistry/structure surface layers such as those formed by Lithium triniobate ($LiNb_3O_8$). While several alternative materials can be used as the buffer material, in one embodiment, the III-nitride material itself may be deposited as a buffer layer, prior to deposition of further layers of the III-nitride material.

The deposition process can optionally incorporate the use of an atomic terrace or "step" structure that may be located upon a horizontal surface of the substrate. This method is especially useful when a lithium niobate Tantalate ($LiNb_zTa_{1-z}O_3$) where $0 \leq z \leq 1$, film is deposited upon a SiC substrate. The step structure causes the lattice structure of the deposited film to align itself well to the lattice structure of the substrate, minimizing rotationally symmetric defects. These atomic terraces can be prepared via a variety of methods as is known in the art including, vicinal wafer slicing/polishing, high temperature hydrogen anneals and similar approaches. This type of "automatic" alignment provides enhanced semiconductor junction properties.

Figure 4:
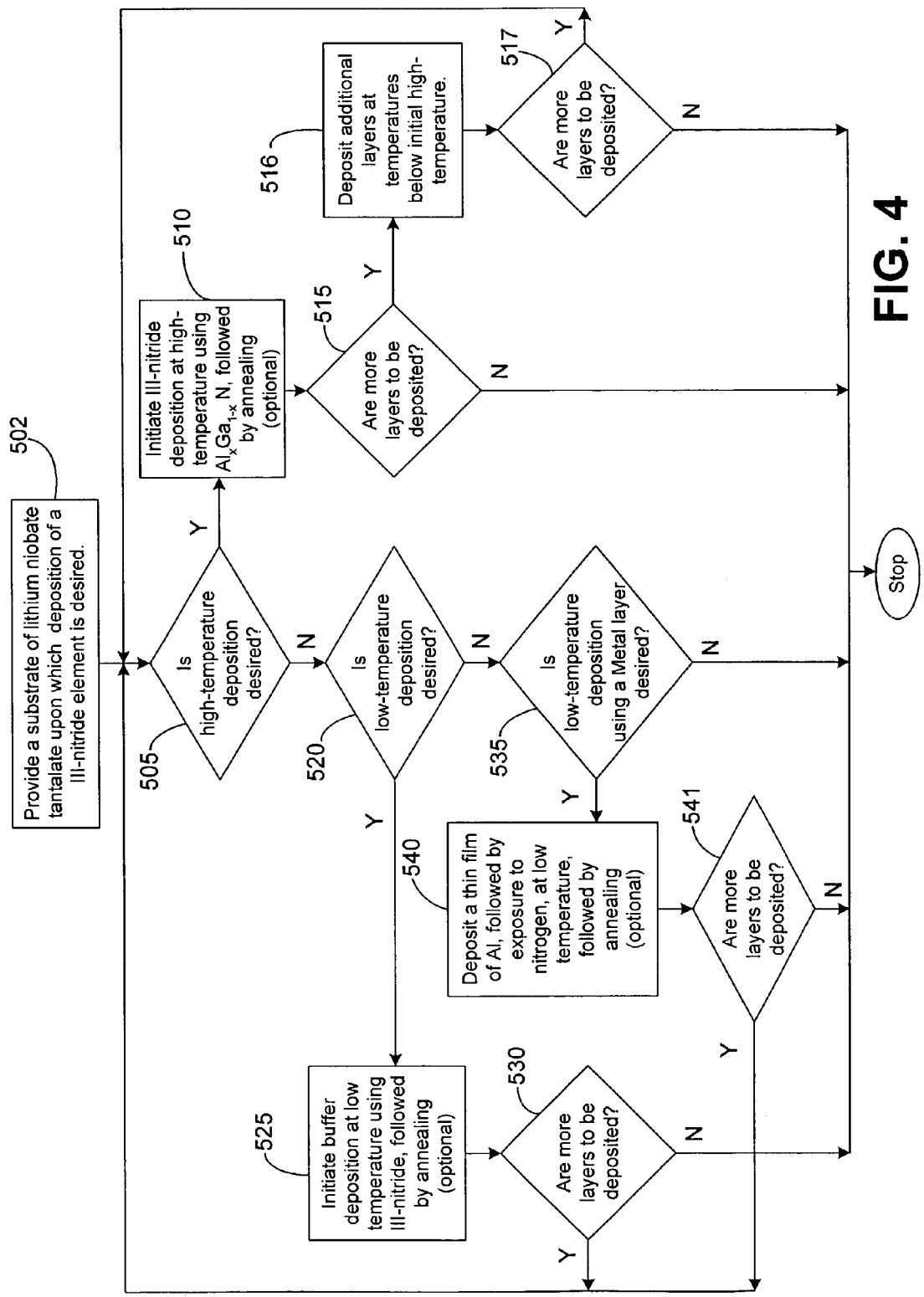
FIG. 4 illustrates alternative methods for growing III-nitride films upon a lithium niobate/tantalate substrate.

FIG. 4 illustrates the alternative procedures for growing buffer layers on a lithium niobate, lithium tantalate, or lithium-niobate-tantalate substrate. A substrate of lithium niobate tantalate is provided in block 502. In decision block 505 a determination is made if high temperature deposition of a III-nitride element upon this substrate is desired. If desired, step 510 is implemented. In step 510, III-Nitride deposition at a high temperature (typically carried out at a top range of 900–1100° C.) using a layer of $Al_xGa_{1-x}N$ ($0 \leq x \leq 1$), preferably AlN, is initiated. Such deposition is optionally followed by an annealing period, wherein the sample is held at an elevated temperature for a period of time under zero growth rate conditions. This allows the material to stabilize before proceeding to the step of block 516. In block 516, additional layers, referred to sometimes as bulk layers, are deposited at temperatures below the initial temperature.

If high-temperature deposition is not desired in decision block 505, a determination is made in decision block 520 if low temperature deposition using III-nitride is alternatively desired. If low temperature deposition is desired, step 525 is implemented. In step 525, III-Nitride buffer material is deposited at <500 degrees C. to a thickness of 0.5 to 70 nm followed by an optional anneal at higher temperatures to improve the crystal quality of the buffer. This deposition can be carried out as various combinations of III-Nitride materials deposited in alternating super-lattice growth layers.

If low-temperature deposition is not desired in decision block 520, a determination is made in decision block 535 if low temperature deposition using a metal layer is desired. If such a growth is desired, in step 540, a thin layer (<0.5 nm) of aluminum is deposited upon the substrate, followed by an exposure of this aluminum to the nitrogen source to convert it to AlN. The aluminum deposition is carried out at low temperatures typically in a range that can vary between 100° C. and 500° C., unlike the deposition of III-nitride material which may be performed at either high or low temperatures as mentioned earlier. An annealing procedure at higher temperatures may also be carried out as part of step 540.

Steps 516, 525, and 540 may be followed by further deposition of layers utilizing one or more of the process described. This is shown in FIG. 4 by decision blocks 530, 541, and 517.

Figure 5:
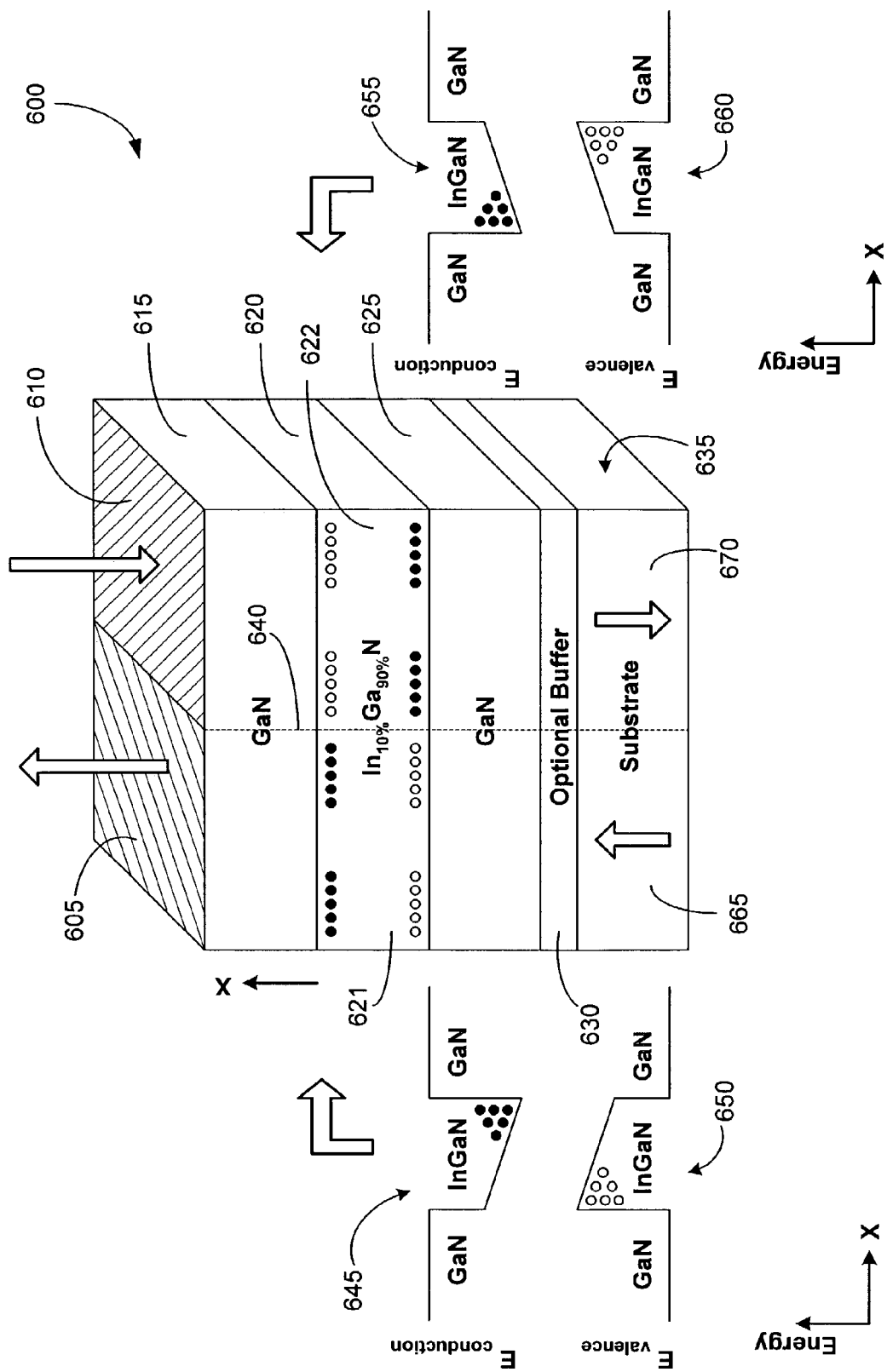
FIG. 5 illustrates a device that uses a periodically poled substrate with III-nitride films, such as GaN, grown upon the substrate.

FIG. 5 illustrates a device 600 formed by depositing III-nitride film on a lithium niobate substrate. FIG. 5 will be used to explain the polarization properties of GaN films grown on lithium niobate. The use of lithium niobate as a substrate for III-Nitride based films provides the ability to control polarization in selected areas of the substrate, thereby enabling new polarization-engineered structures. Since lithium niobate is a ferroelectric material, its polarization can be controlled by poling, via the application of an external electric field. This electric field can be applied over selected areas of a substrate, thereby producing a desired pattern of polarized material over the substrate. Furthermore, the Curie temperature (where lithium niobate loses its ferroelectric properties and consequently its spontaneous polarization) is high when compared to other ferroelectrics—ranging from ~1142° C. to >1210° C. This polarization value ranges from ~71 µC/cm$^2$ to ~30 µC/cm$^2$ over the temperature range used in III-Nitride growth. Unlike more common perovskite ferroelectrics that have multiple degrees of atomic movement—such as oxygen octahedra and internal metal atom movements, lithium niobate has only one degree of freedom for atomic movement. This one degree of freedom is in the displacement of Li atoms along the three-fold symmetry axis (z-axis).

This property of lithium niobate allows changing the Li atomic position within the interior of a unit cell without perturbing the overall lattice structure around this cell. It must be pointed out that this ferroelectric poling process of lithium niobate does not change its surface chemistry, its lattice constant, or its thermal properties such as the thermal expansion coefficient.

When a GaN film that is grown on a (0001) oriented, poled lithium niobate substrate, is exposed to a phosphoric acid solution for 20 minutes at 150° C., it is found to be Ga-polar. When a GaN film that is grown on a (000$\bar{1}$) oriented, poled lithium niobate substrate, is exposed to a phosphoric acid solution for 20 minutes at 150° C., it is found to be N-polar. The Ga-polar or N-polar structures may be attributed to the minimization of the interface charge due to continuation of the polarity of the substrate into the GaN film. The surface of the lithium niobate is highly polarized due to spontaneous polarization that occurs during the growing process when GaN is grown upon it.

Drawing attention to FIG. 5, a substrate 635 of lithium niobate, or alternatively of lithium tantalate, is shown with two regions 665 and 670 that are poled in opposite directions. This process can be explained by starting with substrate 635 (minus the other layers shown above it) that would be typically manufactured with a uniform poling in one direction. Let us assume that this uniform poling is in the downward direction as indicated in region 670. Therefrom, region 665 would also be poled in the downward direction, unlike the direction shown in FIG. 5. The change in poling direction for region 665 is performed by applying an electric field (not shown) between the top and bottom surfaces of substrate 635 corresponding to region 665, prior to application of the optional buffer layer 630. The electric field is typically applied by installing electrically conductive electrodes on the top and bottom surfaces and connecting a power source between the two electrodes. The change in poling direction occurs due to the ferroelectric property of the substrate. Once upward poling has been accomplished, the metal electrodes are eliminated, and buffer layer 630 is optionally applied over the entire top surface of substrate 635.

In FIG. 5, a III-nitride layer, using GaN for example, is then applied on top of the optional buffer layer 630. This GaN layer 625 assumes upward poling in the area above region 665 due to the upward poling of region 665 of the substrate 635, while simultaneously retaining downward poling in the area above region 670 due to the downward poling of region 670 of the substrate 635. A layer of InGaN 620, typically implemented as In$_{10\%}$Ga$_{90\%}$N is then deposited upon GaN layer 625. This is followed by deposition of GaN layer 615 upon the In$_{10\%}$Ga$_{90\%}$N layer 620. Once grown, this sandwich structure of III-Nitride materials retains its poling characteristics in upward and downward directions, even when subjected to subsequent temperatures exceeding the Curie temperature of substrate 635.

Vertical demarcation line 640 is used to identify the two vertical segments of the III-nitride device 600 that are poled in opposite directions. More such vertical segments can be formed on substrate 635, with the nature of the III-nitride material deposited on this substrate allowing for the formation of each new poled segment without affecting the poling of neighboring segments.

Energy band diagrams 645 and 650 show the energy in the conduction and valence bands of the III-nitride device 600 along the segment on the left, while energy band diagrams 655 and 660 show the energy in the conduction and valence bands of the III-nitride device 600 along the segment on the right. It can be seen that the quantum energy level in the valence band (of diagram 650) corresponding to the In$_{10\%}$Ga$_{90\%}$N segment 621 places the holes along the bottom layer of segment 621, while the quantum energy level for the valence band (of diagram 660) corresponding to the In$_{10\%}$Ga$_{90\%}$N segment 622 places the holes along the top layer of segment 622. Conversely, it can be seen that the quantum energy level in the conduction band (of diagram 645) corresponding to the In$_{10\%}$Ga$_{90\%}$N segment 621 places the electrons along the top layer of segment 621, while the quantum energy level in the conduction band (of diagram 655) corresponding to the In$_{10\%}$Ga$_{90\%}$N segment 622 places the electrons along the bottom layer of segment 622. This causes the electron-hole configuration along the vertical demarcation line 640 to be attracted to one another, such transition thereby causing an emission of concentrated energy out of the junction formed by segments 621 and 622 along the vertical demarcation line 640.

This characteristic emission of concentrated energy can be exploited in the manufacture of various devices such as LEDs and laser diodes that can be designed to emit photonic energy at various wavelengths. Such junctions can also be exploited as semiconductor junctions in the manufacture of high-speed transistors that incorporate a number of other performance advantages that are useful in optical, electrical, and magnetic applications. Other semiconductor products that may incorporate this type of junction include waveguides, optical modulators, wavelength converters, and electro-optical signal processing devices. It will be especially useful in the fabrication of devices that integrate electronic circuitry together with optical circuitry upon a common substrate.

Attention is drawn to this property of selectively poling areas of the substrate 635 in opposite directions, and the subsequent poling effect upon the segments of epitaxial GaN and In$_{10\%}$Ga$_{90\%}$N layers grown on this substrate, in comparison to traditional structures. While the process, sometimes referred to as "periodic-poling", explained with reference to FIG. 5, "freezes" the poled segments, thereby allowing one or more adjacent segments of opposite polarity to be formed without disturbing the poling of a previously formed segment, traditionally-used ferroelectric substrates can lose an initially implemented polarization pattern upon subsequent application of electric fields, or when subsequently subjected to temperatures above the Curie temperature of the substrate. It must be pointed out that freezing refers to the process of ferroelectric poling, whereby an induced charge is created on the surface of the lithium niobate substrate, without a change in the surface chemistry, lattice constant, or thermal properties (such as thermal expansion coefficient) of the substrate.

The above-described embodiments of the present invention are merely set forth for a clear understanding of the principles of the invention. Many variations and modifications may be made without departing substantially from the invention. All such modifications and variations are included herein within the scope of this disclosure and the present invention and protected by the following claims.

I claim:

1. A semiconductor device comprising:
    a poled substrate with a c-face having a hexagonal crystal structure, the substrate having lithium niobate tantalate ($LiNb_zTa_{1-z}O_3$), where $0 \leq z \leq 1$; and
    a group III nitride compound semiconductor layer deposited upon the c-face of the substrate such that a unit cell hexagonal lattice of the group III nitride compound is substantially lattice-matched to the hexagonal crystal structure in the c-face of the poled substrate.

2. The semiconductor device of claim 1, wherein the group III nitride compound is $Al_xIn_yGa_{1-(x+y)}N$, where $0 \leq x \leq 1$ and $0 \leq y \leq 1$ and $0 \leq (x+y) \leq 1$.

3. The semiconductor device of claim 2 further comprising a buffer layer of $Al_xIn_yGa_{1-(x+y)}N$, where $0 \leq x \leq 1$ and $0 \leq y \leq 1$ and $0 \leq (x+y) \leq 1$, located between the substrate and the group III nitride compound semiconductor layer.

4. The semiconductor device of claim 3, wherein the buffer layer of $Al_xIn_yGa_{1-(x+y)}N$, where $0 \leq x \leq 1$ and $0 \leq y \leq 1$ and $0 \leq (x+y) \leq 1$, consists of AlN (x=1, y=0).

5. The semiconductor device of claim 1, wherein the substrate has at least a lithium niobate ($LiNbO_3$) single crystal; the group III nitride compound is $Al_xIn_yGa_{1-(x+y)}N$, where $0 \leq x \leq 1$ and $0 \leq y \leq 1$ and $0 \leq (x+y) \leq 1$; and whereby a hexagonal crystal structure of the $LiNbO_3$ crystal is lattice-matched in substantial symmetry, to a unit cell hexagonal lattice of the group III nitride compound to form the semiconductor device.

6. The semiconductor device of claim 1, wherein the substrate has at least a lithium tantalate ($LiTaO_3$) single crystal; the group III nitride compound is $Al_xIn_yGa_{1-(x+y)}N$, where $0 \leq x \leq 1$ and $0 \leq y \leq 1$ and $0 \leq (x+y) \leq 1$; and whereby a hexagonal crystal structure of the $LiTaO_3$ crystal is substantially lattice-matched to a unit cell hexagonal lattice of the group III nitride compound to form the semiconductor device.

7. The device of claim 1, wherein the c-face is oriented in a <0001> direction or a <000$\bar{1}$> direction.

8. A semiconductor device comprising:
    a substrate with a c-face having a hexagonal crystal structure, the substrate having silicon carbide (SiC); and
    a first layer of lithium niobate tantalate ($LiNb_xTa_{1-x}O_3$) where $0 \leq x \leq 1$, formed on the substrate, wherein when x=1, a unit cell hexagonal lattice of lithium niobate has a mismatch of about 3.1% with 4H SiC (a=3.0730 angstroms).

9. The semiconductor device of claim 7, wherein the first layer is lithium niobate.

10. The semiconductor device of claim 8 further comprising a buffer layer of $Al_xIn_yGa_{1-(x+y)}N$, where $0 \leq x \leq 1$ and $0 \leq y \leq 1$ and $0 \leq (x+y) \leq 1$, located between the substrate and the first layer.

11. A periodically-poled semiconductor device comprising:
    a periodically-poled substrate of lithium niobate tantalate ($LiNb_zTa_{1-z}O_3$) where $0 \leq z \leq 1$; and
    a group III nitride compound semiconductor layer formed on the substrate.

12. The periodically-poled semiconductor device of claim 11, wherein the group III nitride compound is $Al_xIn_yGa_{1-(x+y)}N$, where $0 \leq x \leq 1$ and $0 \leq y \leq 1$ and $0 \leq (x+y) \leq 1$.

13. A semiconductor device comprising:
    a substrate with a c-face having a hexagonal crystal structure, the substrate having silicon carbide (SiC); and
    a first layer of lithium niobate tantalate ($LiNb_xTa_{1-x}O_3$) where $0 \leq x \leq 1$, formed on the substrate, wherein when x=1, a unit cell hexagonal lattice of lithium niobate has a mismatch of about 3.3% with 6H SiC (a=3.0806 angstroms).

14. The semiconductor device of claim 13, wherein the first layer is lithium niobate.

15. The semiconductor device of claim 14 further comprising a buffer layer of $Al_xIn_yGa_{1-(x+y)}N$, where $0 \leq x \leq 1$ and $0 \leq y \leq 1$ and $0 \leq (x+y) \leq 1$, located between the substrate and the first layer.

* * * * *